US007545946B2

(12) United States Patent
Melanson

(10) Patent No.: US 7,545,946 B2
(45) Date of Patent: Jun. 9, 2009

(54) METHOD AND SYSTEM FOR SURROUND SOUND BEAM-FORMING USING THE OVERLAPPING PORTION OF DRIVER FREQUENCY RANGES

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 382 days.

(21) Appl. No.: 11/383,125

(22) Filed: May 12, 2006

(65) Prior Publication Data

US 2007/0253575 A1 Nov. 1, 2007

Related U.S. Application Data

(63) Continuation-in-part of application No. 11/380,840, filed on Apr. 28, 2006.

(51) Int. Cl.
*H04R 5/02* (2006.01)
*H04R 1/02* (2006.01)
*H04B 3/00* (2006.01)
*H03G 5/00* (2006.01)

(52) U.S. Cl. ........................... 381/307; 381/77; 381/89; 381/99; 381/308

(58) Field of Classification Search ................... 381/89, 381/333, 97, 19, 306, 307, 308, 81, 77, 92
See application file for complete search history.

(56) References Cited

U.S. PATENT DOCUMENTS 4,039,755 A 8/1977 Berkovitz
5,005,201 A * 4/1991 Rumreich et al. ........... 381/306
5,301,237 A 4/1994 Fosgate
5,598,480 A * 1/1997 Kim ............................ 381/99
5,680,464 A 10/1997 Iwamatsu
5,809,150 A * 9/1998 Eberbach .................... 381/300
5,870,484 A * 2/1999 Greenberger ............... 381/300
6,057,659 A 5/2000 Akiyama et al.
6,373,955 B1 4/2002 Hooley (Continued)

OTHER PUBLICATIONS

Murray, John, "Understanding Line Array Systems", Live Sound International, prosoundweb.com, 2006.

(Continued)

*Primary Examiner*—Vivian Chin
*Assistant Examiner*—Douglas J Suthers
(74) *Attorney, Agent, or Firm*—Andrew M. Harris; Mitch Harris, Atty at Law, LLC

(57) ABSTRACT

A method and system for surround sound beam-forming using the overlapping portion of driver frequency ranges provides a low cost alternative to present external surround array systems. The overlapping frequency range of a pair of speaker drivers, generally a low-frequency and a high-frequency driver, is supplied with a surround channel information in a controlled phase relationship such that the surround channel information is propagated in a directivity pattern substantially differing from that of main channel information supplied to the low and high frequency drivers. The main channel information is generally directed at a listening area, while the surround channel information is directed away from the listening area so that the surround channel information is heard as a diffuse reflected field. An electronic network provides for control of the surround channel phase relationship and combining of main and surround signals via either an active or passive circuit.

28 Claims, 8 Drawing Sheets

U.S. PATENT DOCUMENTS

| | | | |
|---|---|---|---|
| 6,498,852 | B2 | 12/2002 | Grimani |
| 6,665,409 | B1 | 12/2003 | Rao |
| 6,778,672 | B2 | 8/2004 | Breed |
| 6,937,737 | B2 | 8/2005 | Polk |
| 7,123,731 | B2 | 10/2006 | Cohen et al. |
| 7,382,885 | B1 | 6/2008 | Kim et al. |
| 2001/0038702 | A1 | 11/2001 | Lavoie et al. |
| 2004/0013271 | A1 | 1/2004 | Moorthy |
| 2004/0151325 | A1 | 8/2004 | Hooley et al. |
| 2004/0196405 | A1 | 10/2004 | Spinelli |
| 2005/0041530 | A1 | 2/2005 | Goudie et al. |
| 2005/0175194 | A1 | 8/2005 | Anderson |
| 2005/0177256 | A1 | 8/2005 | Shintani et al. |
| 2005/0226425 | A1 | 10/2005 | Polk |
| 2006/0049889 | A1 | 3/2006 | Hooley |
| 2007/0183608 | A1 | 8/2007 | Willems |

OTHER PUBLICATIONS

Polk, Matthew S. "SDA Surround Technology White Paper", Polk Audio, Nov. 2005.

Product Brochure, Yamaha YSP-1 Digital Sound Projector, 2005.

Product Brochure, Yamaha YSP-1000 Digital Sound Projector, 2005.

* cited by examiner

METHOD AND SYSTEM FOR SURROUND SOUND BEAM-FORMING USING THE OVERLAPPING PORTION OF DRIVER FREQUENCY RANGES

CROSS-REFERENCE TO RELATED PATENT APPLICATIONS

The present application is a Continuation-in-Part of U.S. patent application Ser. No. 11/380,840, filed on Apr. 28, 2006 by the same Inventor and assigned to the same Assignee. The specification of the above-referenced U.S. patent application is incorporated herein by reference.

BACKGROUND OF THE INVENTION

1. Field of the Invention

The present invention relates generally to home entertainment devices, and more specifically, to techniques for sound beam-forming using the overlapping portion of driver frequency ranges in a speaker driver set.

2. Background of the Invention

Audio systems in home entertainment systems have evolved along with theatre audio systems to include multi-speaker surround sound capabilities. Only recently have discrete surround signals been available from sources in home entertainment systems and further only recently have encoded sources reached a sufficient level of home use for consumers to justify installation of the requisite equipment. With the development of Digital Versatile Disc (DVD) technology that provides surround audio source information for movies or surround-encoded music, and sophisticated computer games that provide surround audio, surround speaker installation in home environments has become more desirable and frequent. With the recent availability of digital television (DTV) signals, which can include surround audio signals as part of their audio-visual (A/V) information, increasing sales of televisions and/or DTV sets including surround channel outputs are expected. The surround signals may be encoded in a pair of stereo signals, such as early DBX or as in more recent Dolby or THX surround encoding, or may constitute a fully separate audio channel for each speaker, often referred to as discrete encoding.

In most consumer surround audio systems, an amplifier unit, which may be included in an AV receiver or in a television, provides signals to multiple sets of speakers, commonly in what is referred to as a 5.1, 6.1 or 7.1 arrangement. The 5.1 arrangement includes right, center and left main speakers located in the front of the room, and a right-left pair of surround speakers located in the rear of the room for providing an aural environment in which sounds can be psychoacoustically located such that they emanate from any horizontal direction. The “0.1” suffix indicates that an additional subwoofer is provided for providing low frequency sounds that are typically not sensed as emanating from a particular direction. The 6.1 configuration adds a center channel speaker in the surround speaker set and in a 7.1 configuration, an additional pair of speakers is included over the 5.1 configuration and located even farther back in the room from the surround channel speakers.

However, proper installation of surround channel speakers can be costly and undesirable in many home environments. Wiring must be added, and locations with unobstructed paths to the listening area must be available. Since the surround channel audio sources are generated for a particular location of the speakers, they cannot be simply placed at any location in the room and still function properly. It is desirable to position the surround speakers in such a way that the surround sound is diffuse, often limiting possible locations for speaker placement. The term “diffuse” indicates that the sound does not appear to emanate from a single direction, which is generally provided via reflections from one or more surfaces that cause the sound to be reflected toward the user from multiple angles.

There are essentially two types of surround sound implementations for handling the additional surround channel information: simulated surround and actual surround. In actual surround sound implementations, surround channel signals are provided to speakers placed behind the listener. In simulated surround implementations, the surround channel signal is provided to speakers placed in front of the listener.

Simulated surround sound implementations typically use filtering and/or delays to alter mono or stereo audio signals to provide outputs for additional front speakers to generate the surround field. U.S. Pat. No. 6,937,737 describes a simulated surround sound system that provides the right and left surround channel information to each side (right and left) of an additional stereo speaker pair as well as to each side of the main stereo speaker pair. The frequency response of the system is controlled to cause the apparent position of the surround channel information to appear wider than the speaker position. However, such systems do not provide surround sound performance approaching that of actual surround sound implementations.

Therefore, beam-forming systems have been developed that provide surround sound fields from encoded or discrete sources that are not only widening systems, but form beams that can direct the sound toward walls and away from the listener, thus providing the surround channel information as reflections. Such systems typically use a large horizontally distributed array of speakers in order to form separate beams for the surround channel sources that direct the surround channel sound away from the listener toward the walls so that the surround channel sounds arrive later and from a different angle. However, such arrays are costly, as separate drivers must be provided for each element in the array. Further, tuning of such an array system can be complicated by the lack of unobstructed paths to the reflection zones at the walls of the room. U.S. published Patent Application 20040151325A1 describes such a large horizontal array beam-forming system, and U.S. published Patent Application 20050041530A1 describes a two-dimensional array system that provides a beam focused in both horizontal and vertical planes.

Most full-range speaker systems used in high fidelity stereo and main channel installations include multiple drivers, such as two-way (woofer/tweeter) or three-way (woofer/midrange/tweeter) speakers. However, the operation of each driver is typically assigned to a specific frequency band by a crossover network that filters the input audio signal to provide the proper signals for each driver. Such a network is also generally necessary to protect the high-frequency driver (tweeter) from damage due to low frequency content. Due to the discrete frequency range assignment, multi-driver speakers are not usually employed in the above-described array systems, and instead, a uniform set of drivers is employed in the same frequency range in order to provide beam-forming in the particular range of the set of drivers.

Therefore, it would be desirable to provide a beam-forming speaker system that can provide simulated surround sound without requiring an array with a large number of elements, and that further reduces the difficulty in providing an unobstructed path for the beam(s). It would further be desirable to provide a beam-forming speaker system without requiring any extra drivers over that usually found in high-fidelity main channel installations.

SUMMARY OF THE INVENTION

The above stated objective of providing a beam-forming speaker system without requiring an array with a large number of elements and with no additional drivers is satisfied in a method and system. The method is a method of operation of the system or a device incorporating the elements of the system.

The system uses a set of at least two drivers having substantially differing frequency ranges, such as a pair of drivers used in a stereo two-way speaker. The overlapping portion of the frequency ranges of the drivers is used in substantially opposing polarity response with respect to a surround channel input, in order to generate one or more beams directed away from a listening position, so that the surround channel is heard substantially only as reflections. The beam may be directed above the listener, or to the right or left, depending on the orientation of the drivers with respect to each other. The response to main channel information is provided to the drivers in an ordinary manner, with a phase-alignment of matching polarity, thus providing a wide beam directed at the listening position for the main channel information.

An electronic network receives the main and surround channel information and combines them to produce the signals provided to the drivers. The network may be a passive network for power-splitting, or an active circuit driving power stages, and may be included within a speaker cabinet.

Alternatively, the network may be provided as part of a device such as a receiver or television that has separate outputs for each driver in external driver pairs. Also alternatively, the drivers may be included within a device such as a television or portable stereo, along with the electronic network, providing a compact surround beam-forming solution. Each side of a stereo speaker set may be provided with such a set of beam-forming drivers so that two main and two surround beams are provided by the system. Additional speakers or sets of beam-forming speakers can be added to the system to increase the quality of the sound reproduction.

Details of the invention and the uses thereof will be understood by a person of skill in the art when reading the following description in conjunction with the drawings. Further objectives and advantages of the invention will be apparent in light of the following description and drawings, wherein like reference numerals indicate like components.

DESCRIPTION OF ILLUSTRATIVE EMBODIMENT

Figure 1:
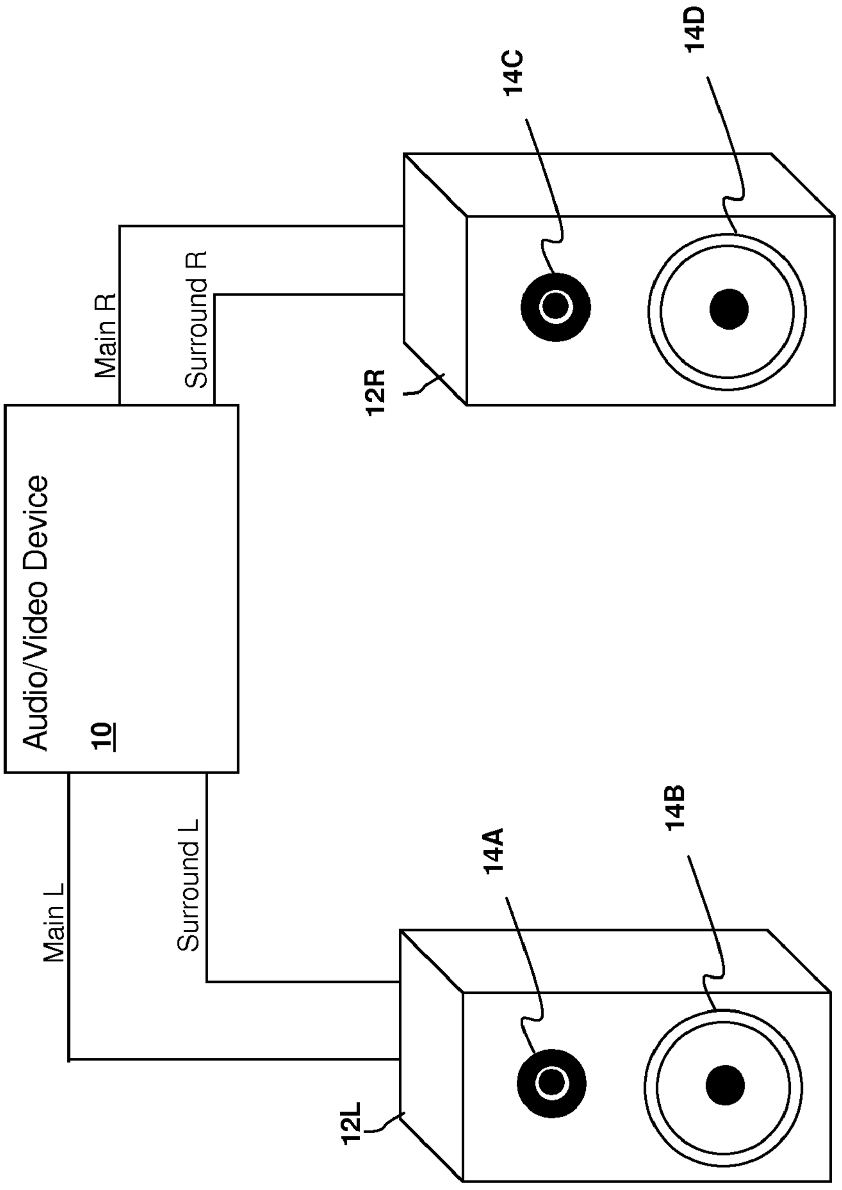
FIG. 1 is a pictorial diagram of a system in accordance with an embodiment of the present invention.

The present invention encompasses systems and methods that include a pair of speaker drivers in a surround sound beam-forming process. The speaker drivers have substantially differing frequency ranges, e.g., the woofer and tweeter of a 2-way speaker system or woofer and midrange driver of a 3-way speaker system, and main channel content is provided in a normal crossover fashion between the woofer and tweeter (and midrange) over the full audio range, so that the main channel information is propagated toward a listening area. The main channel information is generally provided in a wide main directivity pattern that is provided on-axis to a listening area. In the present invention, surround channel information is provided in a controlled-phase relationship in the overlapping frequency range of the speaker drivers that differs from that of the response of the drivers to the main channel information. The differing controlled-phase relationship forms a second directivity pattern that is directed away from the listening area, so that most of the surround channel information is reflected at least once before reaching the listening area. The surround channel information and main channel information are thereby superimposed on the listening environment in differing directions by two speaker drivers by virtue of a phase relationship between each driver that differs with respect to the main and surround channel signals in the overlap region.

There are many different approaches to crossover design, such as Linkwitz-Riley crossovers, and the actual driver polarities may match or be reversed with respect to the main channel signals for frequencies far from the crossover region, depending on the crossover design. Therefore, while the polarity of the driver outputs may be reversed for the main channel signals outside of the crossover region, the main channel information is applied such that a substantially uniform frequency response is maintained on-axis with respect to the set of speaker drivers. In the present invention, the surround channel content is provided in a controlled phase relationship, which generally provides an on-axis null at the desired listening position, but due to the above crossover design considerations may be substantially in the same polarity or opposite polarity as the main channel information for overlapping response regions of the drivers away from the crossover frequency region of the main channel.

By directing the surround channel information away from the listening area, the surround content is heard only as diffuse reflections, providing the ability to simulate a surround sound listening environment from speakers positioned only at one end of a room. However, the speakers may be located at other positions in the room, with the surround channel directivity pattern increasing the diffusion by directing the surround channel information away from the listener. For example, the techniques of the present invention may be implemented in rear speakers of a 5.1 speaker configuration to provide a simulated 7.1 surround sound implementation.

The in-phase inputs (main channel inputs) of the speakers of the present invention can be connected to the side channel outputs of a receiver or other 7.1 surround sounds device and the controlled-phase inputs (surround channel inputs) of the speakers are connected to the back channel outputs of the receiver, providing an acoustic environment that is experienced as larger than the actual room size.

The system may be incorporated within an audio/video device having speakers included for the rendering of audio content, such as a DTV or computer monitor, or may be an audio-only device, such as a stereo system having internal speakers. The system may also be incorporated in stand-alone speaker systems that include an internal electronic network that provides outputs to the speaker drivers to form a beam for direction of the surround channel information, or separate high and low frequency driver power outputs can be provided from another unit incorporating the electronic beam-forming network.

Referring now to the Figures, and in particular to FIG. 1, a system in accordance with an embodiment of the present invention is illustrated. The illustrated system is an audio/video (AV) device 10 connected to an external stereo set of speakers 12L and 12R, each having a corresponding surround and main channel input coupled to AV device 10. Each speaker 12L,12R includes at least two drivers 14A,14B and 14C,14D, respectively. In the exemplary system of FIG. 1, drivers 14A and 14C are tweeters for reproducing the high-frequency portion of the overall audio program. Drivers 14B and 14D are woofers for reproducing the low-frequency portion of the overall audio program. However, the illustration is exemplary only and the techniques of the present invention may be applied to other types of speaker systems having more than two drivers, including three-way speaker systems.

Each of speakers 12L,12R includes an internal electronic network (not shown) that combines the main and surround channel signals received by each speaker in order to form two differing "beams" or differing directivity patterns. The first beam, which carries the main channel information, is generally the same as for an ordinary speaker, that is, driver pairs 14A,14B and 14C,14D are phase-aligned to reproduce the main channel information at a listening area directly in front of speakers 12L,12R. However, in an overlapping range of frequencies, driver pairs 14A,14B and 14C,14D are provided with surround channel information in a controlled phase/frequency relationship as between the drivers in each woofer/tweeter pair, so that a second directivity pattern directed away from the listening area is produced for the surround channel information. The result is that the surround channel information is directed toward the walls, floor and/or ceiling of the room so that arrival of the surround channel information at the listening area is heard only as diffuse reflections.

Figure 2:
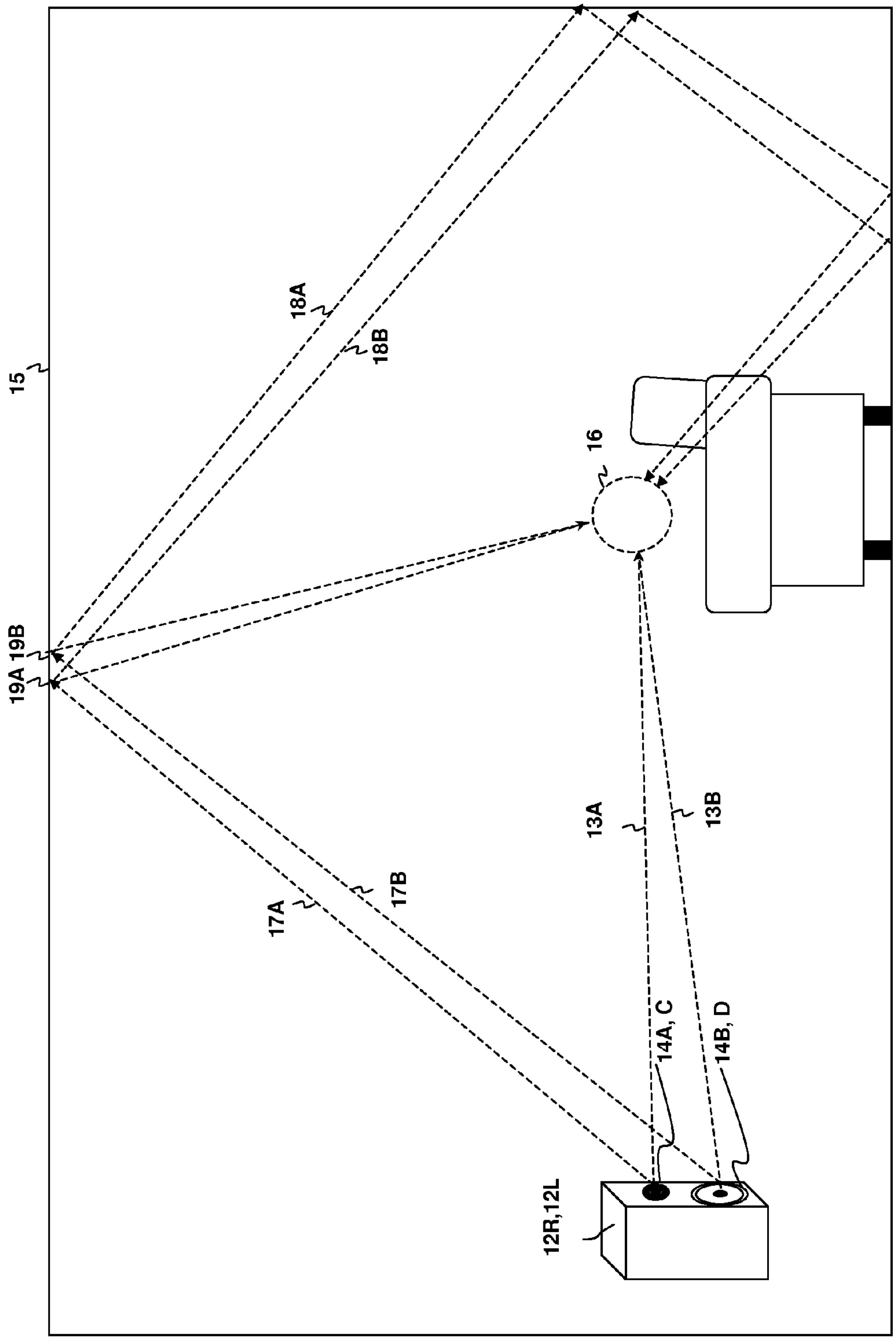
FIG. 2 is a side view of a listening environment including a system in accordance with an embodiment of the present invention.

Referring now to FIG. 2, a side view of a listening environment including the system of FIG. 1 is depicted. The main channel information reproduced by speakers 12L,12R propagates along a direct path 13A,B providing the first arrival of main channel sounds at a listening area 16. The surround channel information is provided in an overlap region of frequencies reproducible by both tweeter drivers 14A,C and woofer drivers 14B,D of each speaker 12L,12R and is phase-aligned in a substantially out-of-phase relationship as between tweeter driver 14A,C and woofer driver 14B,D in the overlapping frequency region so that a null is produced along direct path 13A,B. Due to the spacing between tweeter drivers 14A,C and woofer drivers 14B,D, and the phase vs. frequency relationship maintained between tweeter driver 14A,C and woofer driver 14B,D, the surround channel information is then propagated along path 17A, 17B. The surround channel information is reflected at point 19A, 19B of ceiling 15 and is reflected toward listening area 16 and/or along paths 18A, 18B, which cause the surround channel information to arrive much later at listening position 16 and to be heard as diffuse (non-directional).

The vertical orientation of the speakers is not a limitation of the present invention, as in some embodiments of the invention disclosed in the above-incorporated parent U.S. patent application, and it is understood that horizontal orientation of speakers 12L,12R will cause the surround channel information to be diffused by reflections from the walls of the room.

The surround beam-forming implemented in the system of the present invention uses a limited band of overlap frequencies that within the reproducible frequency range of both drivers 14A,B (and similarly 14C,D) of speakers 12R,12L. Generally, tweeter drivers 14A and 14C can only be used to a certain low-frequency cutoff without damage, although via protection mechanisms incorporated within embodiments of the present invention as detailed below, that low-frequency cutoff can be extended below the cut-off typically specified for the tweeter drivers. For the above-stated reason, tweeter drivers 14A and 14C should generally not be of a type incorporating internal protection capacitors. The useful overlap range is limited at the high-frequency end by the response of woofer drivers 14B and 14D, which can be extended via the use of a "whizzer cone" type woofer and/or sufficient power amplification to overcome the loss of woofer response without amplifier clipping or overheating of the woofer coil. Further, the usable high-frequency overlap range is further limited by the spacing between drivers 14A and 14B (and similarly drivers 14C and 14D) due to "combing" or degeneration of the surround channel beam into multiple beams.

In general, practical overlap frequency ranges will extend from approximately 500 Hz to 2500 Hz, due to the spacing between the drivers, and the response of the woofer and tweeter. However, the practical overlap range can be "learned" during the calibration process described below and the surround channel frequency range adjusted in conformity with the calibration measurement results. Also, special drivers or midrange/tweeter drivers can be used to extend the low frequency range down to approximately 250 Hz. Operation down to 250 Hz is very desirable, since in typical program material, much directional information is present in the range of 250 Hz to 500 Hz. The calibration process can determine the amount of gain boost required in order to match the woofer and tweeter level at low frequencies and then decide a practical low-frequency cut-off for beam-forming from the gain determination. Similarly, the high-frequency limit for the woofer can be determined from the amount of gain boost required to match the woofer level to the tweeter level and/or determination of a high-frequency point at which the surround beam starts to degenerate in shape.

Figure 3:
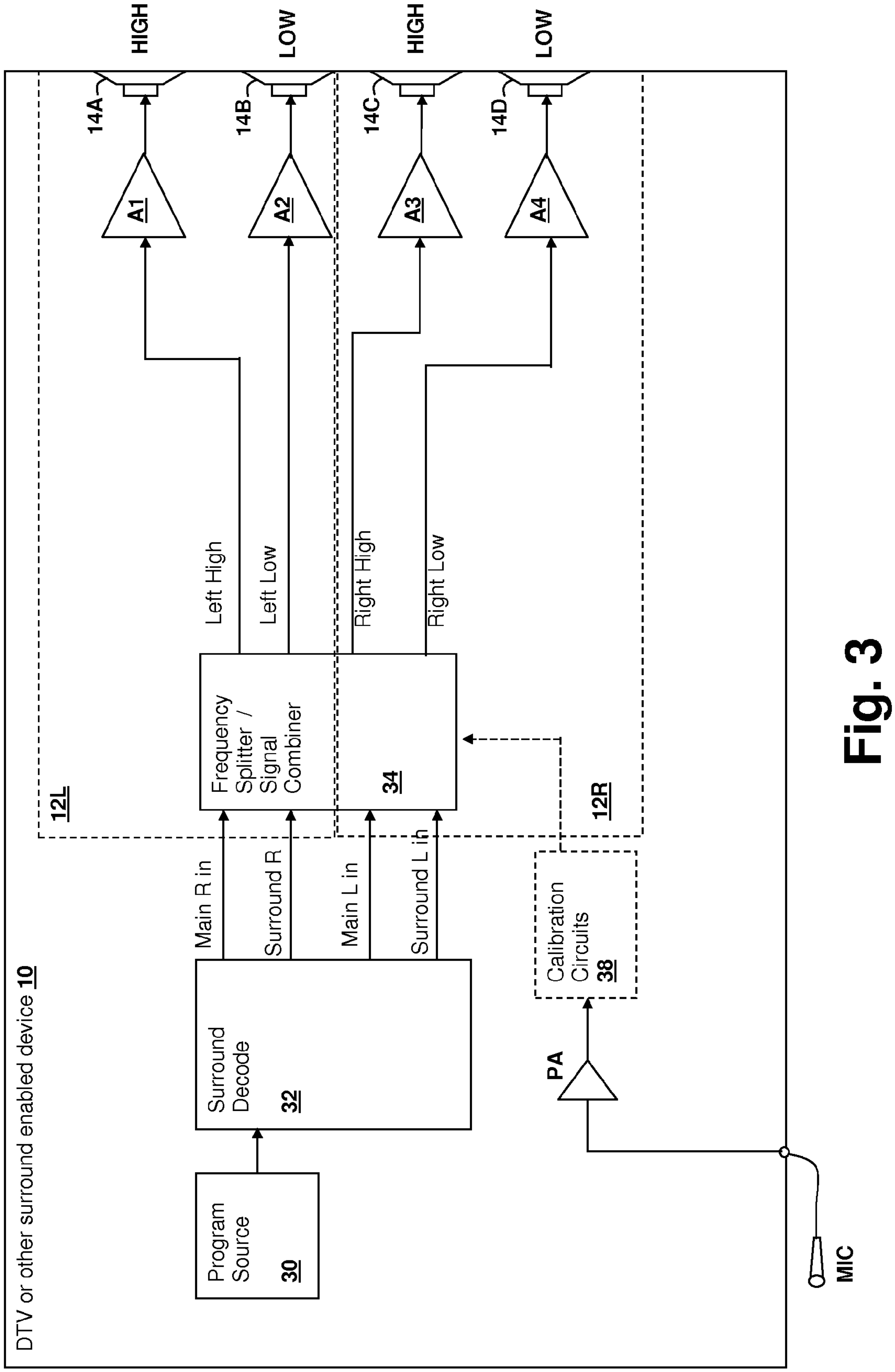
FIG. 3 is a block diagram of the system depicted in FIGS. 1-2.

Referring now to FIG. 3, a block diagram of circuits within the system of FIG. 1 is shown. A DTV or another surround-enabled device 10 includes a program source 30, which may also be provided or selected from an external connection, that supplies a surround decode circuit 32 with program information. Surround decode circuit 32 provides main channel and surround channel outputs to a frequency splitter/signal combiner network 34. In applications in which program source 30 does not contain surround channel information, surround decode circuit 32 can include a surround synthesizer circuit for generating simulated surround information from a stereo program.

Frequency splitter/signal combiner network 34 divides the main channel information into high frequency and low frequency bands as in a standard active crossover network. However, frequency splitter/signal combiner network 34 also combines the surround channel information to provide signals to the inputs of amplifiers A1-A4 such that the surround channel information is directed away from the listening position, while the main channel information is presented directly toward the listening position. The outputs of amplifiers A1-A4 are provided to speaker drivers 14A-14D, which can be included within the cabinet of device 10 or optionally located in external speakers 12L and 12R, in which case the associated amplifiers A1-A4 may also be included within the cabinets of external speakers 12L and 12R and frequency splitter/signal combiner network 34 divided across two circuits, one in each speaker cabinet. Additionally, if surround decode circuit 32 provides synthesized surround sound, the synthesizer circuits can be incorporated within external speakers 12R and 12L providing speakers that can synthesize a surround image from just a main channel signal.

If amplifiers A1-A4 are included within device 10, frequency splitter/signal combiner network 34 may be made reconfigurable, so that use with traditional main and surround channel speakers can be selected for one "standard" operating mode, with the main and surround channel information amplified and supplied to external speaker connections. Then in another operating mode in accordance with an embodiment of the present invention, the external speaker connections are supplied as connections to high-frequency/low-frequency driver pairs as described above. In particular, an audio/video receiver (AVR) can be provided that in standard operating mode will perform as a standard AVR with power outputs and in a second operating mode provide power outputs for operation with a 2-way speaker system having separate terminals for each driver. Also, if the AVR has line outputs instead of power outputs, special external powered speaker cabinets may be provided that have separate line inputs for connection to each of amplifiers A1-A4, which are then provided within the external speaker cabinets.

An optional calibration circuit 38 may be included and connected to a microphone MIC input via a preamplifier PA. Microphone MIC is ideally an omni-directional microphone, so that all responses with respect to a given speaker or combination of speakers is detected during calibration. When all of the electronics and drivers are included within device 10, it is advantageous to provide calibration circuits 38 and tunable filters within frequency splitter/signal combiner network 34 so that the directivity patterns associated with the main and surround channel information can be optimized to a particular room and installation.

However, calibration is not required to practice the present invention and in particular, if drivers 14A,B and 14C,D are located in corresponding separate external speaker cabinets 12L and 12R, the electronic network may be a pre-tuned or manually tunable digital or analog circuit that performs the phase alignment between the drivers. If pre-tuned external speakers are employed, the tuning is generally 180 degrees out of phase for the surround channel overlap frequency range, in-phase for the main channel and low-frequency surround, and high-frequency surround sent only to the tweeter. However calibration can also be performed with external speaker cabinets if the Left High, Left Low, Right High and Right Low are either provided via connections, in amplified or un-amplified form, to non-powered or powered external speakers, respectively. Alternatively, separate calibration circuits may be included within external powered speakers.

Figure 4A:
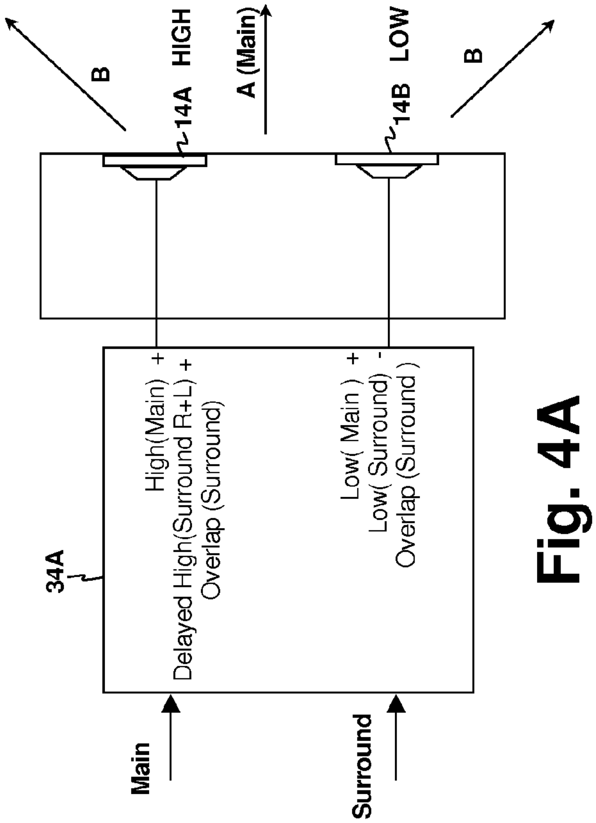
FIG. 4A is an illustration showing a speaker arrangement that can be employed in the system of FIGS. 1 and 2.

Referring now to FIG. 4A, an illustration showing a speaker arrangement that may be employed in the system of FIGS. 1-3 is depicted in accordance with an embodiment of the present invention. In the depicted embodiment, driver 14A provides operation at higher frequencies and driver 14B provides operation at lower frequencies. Both drivers are active in the overlap beam-forming frequency range. Driver 14A is generally a tweeter and driver 14B is generally a woofer. However, limited frequency responses in the drivers themselves is not required to practice the invention. A simplified combiner 34A is shown for illustrative purposes that receives a Main channel signal and a Surround channel signal.

The signal provided to driver 14A combines the high-frequency portion of the main signal, a delayed and combined high-frequency portion of the surround channel signal, and the overlap frequency range portion of the surround signal. The delayed high-frequency portion of the surround channel signal is provided so that any high-frequency content of the surround channel is not lost and is generally formed by summing the high-frequency portions of the surround channel signals from right and left after delaying them by different time delays. The result is a more diffuse (non-directional) presentation of the surround channel high-frequency information.

The signal provided to driver 14B combines the low-frequency portion of the main signal, the low-frequency portion of the surround channel signal, and overlap frequency range portion of the surround channel signal in opposite polarity to that supplied to driver 14A. There is no need to combine the right and left channel low-frequency information, as that information is generally non-directional.

The result of the operation of combiner 34A is that combiner 34A operates as a standard crossover network for the Main channel signals and as a beam-forming network for the overlap frequency range portion of the Surround channel signal. Thus, the overlap frequency range portion of the Surround channel signal is provided out-of-phase (as between drivers 14A and 14B in the overlapping frequency range) along the direct path to a listener located on-axis between drivers 14A and 14B, (e.g. directly in front of speaker 12L) thus producing a null with respect to the surround channel information toward the listener. Thus, the listener will not hear the surround channel information as emanating from speaker 12L, but will hear the surround channel information as diffuse, coming from a range of reflection points primarily along the ceiling and/or the rear of the room.

The main channel information is provided in-phase (as between drivers 14A and 14B and normalized to whatever crossover polarity is employed) along the direct path, so that the main channel information is heard as emanating from the speakers. In the low-frequency range, the main and surround channel information are combined and are only supplied to driver 14B, and in the high-frequency range, the main channel information is provided only to driver 14A and the surround channel information delayed and combined across right and left channels to diffuse the sound.

Figure 4B:
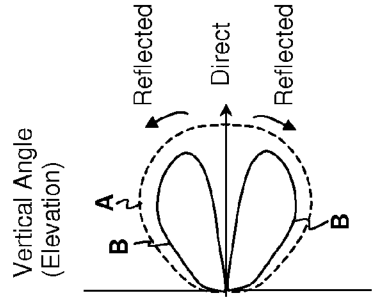
FIG. 4B is a graph showing sound pressure level directivity patterns produced by the speaker arrangement of FIG. 4A.

Referring now to FIG. 4B, a directivity pattern is shown for vertical orientation of the speaker arrangement of FIG. 4A. Directivity pattern A is shown as having a substantially cardioid shape and carries the main channel information, low frequency surround information and the diffused high frequency surround information. Directivity pattern B has two lobes, one directed at the ceiling and one directed at the floor, due to the displacement of drivers 14A and 14B and the out-of-phase alignment of the surround channel information in the overlap frequency range. For horizontal orientation of the speaker arrangement of FIG. 4A, the pattern of FIG. 4B will be rotated to the azimuth, providing lobes in pattern B directed at the side walls of the room.

Figure 4C:
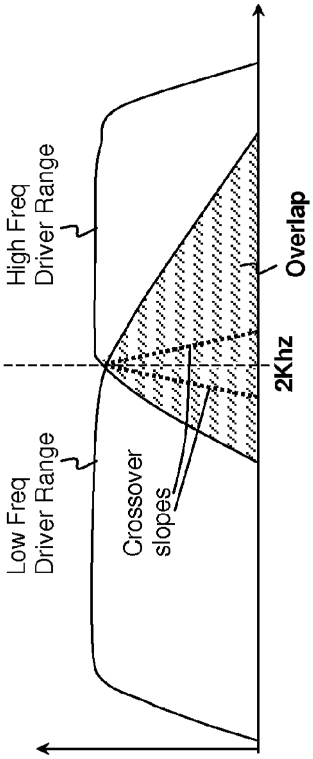
FIG. 4C is a graph illustrating a frequency response of speaker driver channels within the system of FIGS. 1 and 2.

FIG. 4C illustrates the frequency response of drivers 14A and 14B and the crossover filtering scheme of combiner 34A in which beam-forming is employed in the shaded overlap frequency band shown. The crossover slopes (dotted lines) show the main channel crossover frequency locations, which differ from the overlap frequency range boundaries.

Figure 5A:
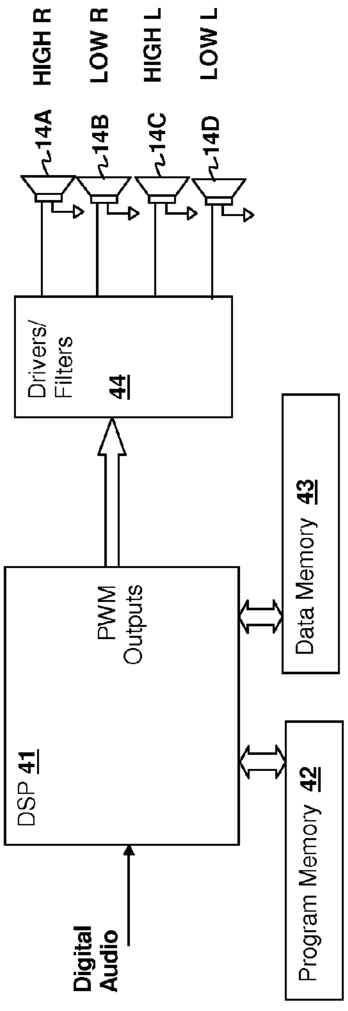
FIG. 5A is a block diagram of a system in accordance with another embodiment of the present invention.

Referring now to FIG. 5A, a system in accordance with an embodiment of the present invention is shown. The depicted system employs a digital signal processor (DSP) 41 that performs the signal combining/filtering functions, as well as frequency-band splitting and any compression/protection algorithms used in the system. DSP 41 is coupled to a program memory 42 containing program instructions forming a computer program product in accordance with an embodiment of the present invention, and further coupled to a data memory 43 for storing data used by the computer program and results produced thereby. The outputs of DSP 41 are depicted as pulse-width modulator (PWM) outputs for each channel, with corresponding low-pass filters and driver transistors 44, generally half-bridge circuits with series LC filters connected to drivers 14A-14D. The signal combining, filtering and compression functions performed by the algorithms of the computer program embodiment will be described in further detail below in illustrations that apply to discrete circuits as well as the algorithms executed by DSP 41.

Figure 5B:
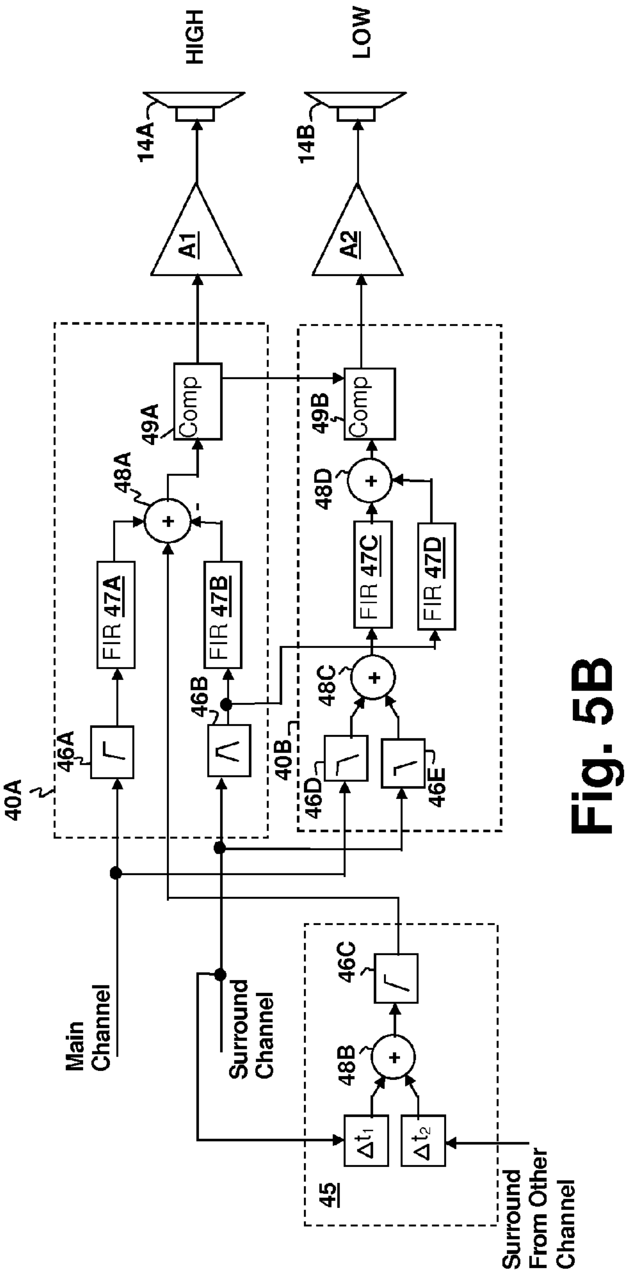
FIG. 5B is a block diagram of a system in accordance with another embodiment of the present invention.

Referring now to FIG. 5B, a direct and surround channel circuit or algorithm in accordance with an embodiment of the present invention is shown in a block diagram. Only one stereo side (right or left) of the system is shown with respect to high frequency processing block 40A and low frequency processing block 40B, as the other side will generally be an identical circuit. However a common high-frequency surround channel diffusion block 45 is shown that includes differing delays ?$t_1$,?$t_2$ a summer 48B to combine the delayed right and left surround channel signals and a high-pass filter 46C to provide the diffused high-frequency surround information to a combiner 48A within high-frequency processing block 40A that supplies the signal provided to driver 14A through amplifier A1 and tweeter protection compressor 49A.

High-frequency processing block 40A also includes a crossover high-pass filter 46A for the main channel, an overlap frequency range filter 46B for the surround channel and a combiner 48A that combines the output of filter 46A, the inverted output of filter 46B, and the output of high-frequency surround channel diffusion block 45. Optional finite impulse response (FIR) filters 47A and 47B provide for adjustment of main channel and surround channel phase vs. frequency response for calibrating the system. Compressor 49A acts to prevent damage to driver 14A when low-frequency content would otherwise damage driver 14A. Compressor 49A is especially desirably present since the characteristic of filter 46B or of FIR filter 47B is tailored to raise the level of lower overlap frequencies provided from driver 14A to match that of driver 14B for effective production of an on-axis null for the surround channel information. Compressor 49A can be alternatively located between FIR filter 47B and combiner 48A in order to compress only the surround channel information within the signal provided to driver 14A.

Low-frequency processing block 40B includes a crossover low-pass filter 46D for the main channel and an overlap frequency range filter 46E for the surround channel and a combiner 48C that combines the outputs of filters 46D and 46E. The output of combiner 48C is combined with the non-inverted output of filter 46B from high-frequency processing block 40A to provide an opposite phase version of the surround channel signal in the overlap frequency range to driver 14B via amplifier A2. While the illustrative structure of processing blocks 40A and 40B show identical polarity for the main channel information and opposing polarity, it will be understood that once crossover considerations are taken into account with respect to the main channel signal, the polarity of the main channel signal may well be reversed, as well. The primary consideration is that the response of the main channel over frequency in the crossover region is uniform on-axis, while the response of the surround channel information produces a directivity pattern that is directed away from the on-axis listening position. Optional FIR filters 47C and 47D provide for adjustment of main channel and surround channel phase vs. frequency response for calibrating the system. An optional compressor 49B, which receives the outputs of filters 47C and 47D as combined by combiner 48D, acts to prevent amplifier clipping when the increased gain of either filter 46E or FIR filter 47D raises the gain of low-frequency processing block 40B with respect to the surround channel information in the higher-frequency portion of the overlap frequency range. Also, if compressor 49B receives control signals from compressor 49A, the match in level between the surround channel overlap signals provided to drivers 14A and 14B can be maintained for beam-forming while compressor 49A is acting to protect driver 14A.

The channel circuit of FIG. 5B is an example of an arrangement of blocks that implement an embodiment of the present invention or cascaded functions that can be applied in a DSP algorithm. However, alternative implementations are possible and in some instances preferred. For example, all of the filtering functions could be performed within FIR filter blocks, with the in-phase/out-of-phase midrange beam-forming summations performed also within the FIR filter blocks. Likewise, speaker protection compression can be made part of the filter algorithm, as well. Therefore, a more generic expression of a channel circuit in accordance with an embodiment of the present invention can be made as a set of FIR filters each receiving either a Main or Surround channel signal and having output summed for forming the input signals to amplifiers A1 and A2. Additional FIR filters for each discrete other speaker may be provided (e.g., center speaker or additional horizontally distributed speakers).

Alternatively, a traditional crossover provided by filters 46A and 46D can act without any FIR filter adjustment and a single FIR filter 47B or 47D can be used to calibrate or otherwise tune only the relationship between the overlap frequency range surround channel information provided to drivers 14A and 14B so that the on-axis surround channel null can be optimized and/or the position of the lobes in the surround channel beam directed to maximize the diffusion of the sound.

Figure 6:
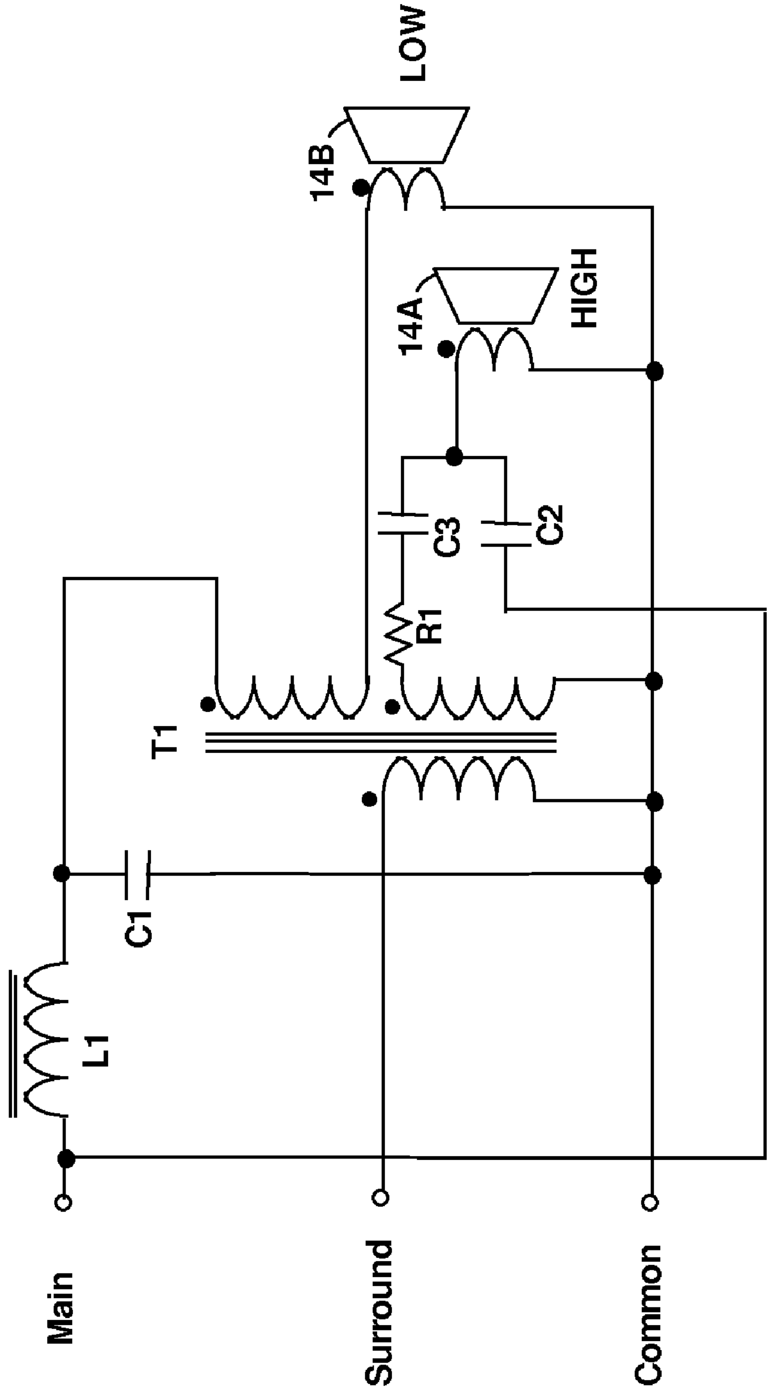
FIG. 6 is a schematic diagram of a speaker circuit in accordance with still another embodiment of the present invention.

Referring now to FIG. 6, a completely passive alternative to the digital signal processing or analog network solutions described above is illustrated. Within each speaker (e.g., speakers 12L, 12R of FIGS. 1 and 2), a transformer T1 can be used with crossover elements to combine the surround channel information with the main channel information provided by two powered signals, such as main and surround channel outputs provided from a receiver that includes amplification. A low-pass crossover filter provided by inductor L1 and capacitor C1 is series-connected with a winding of transformer T1 to supply a signal to low-frequency driver 14B. The surround channel signal is provided to another winding of transformer T1 so that the surround channel information is added to the low-frequency main channel information supplied to driver 14B. The series connection of the winding is in opposite phase with the winding receiving the surround channel signal. High-frequency driver 14A receives the higher frequency main channel information coupled via a capacitor C2 and an in-phase version of the surround channel information coupled through resistor R1 and capacitor C3 from a third winding of transformer T1. The depicted network acts both as a crossover for the main channel signal and as an out-of-phase combiner for the surround channel signal, with capacitor C3 providing some level of protection for driver 14A via restriction of the lower-frequency end of the overlap frequency range. Resistor R1 and capacitor C3 set the upper corner frequency of the range for which the surround signal is applied to driver 14A. A three-way passive network can be similarly implemented with transformer T1 windings coupling a surround channel signal to woofer and midrange drivers, rather than woofer and tweeter as shown.

Figure 7B:
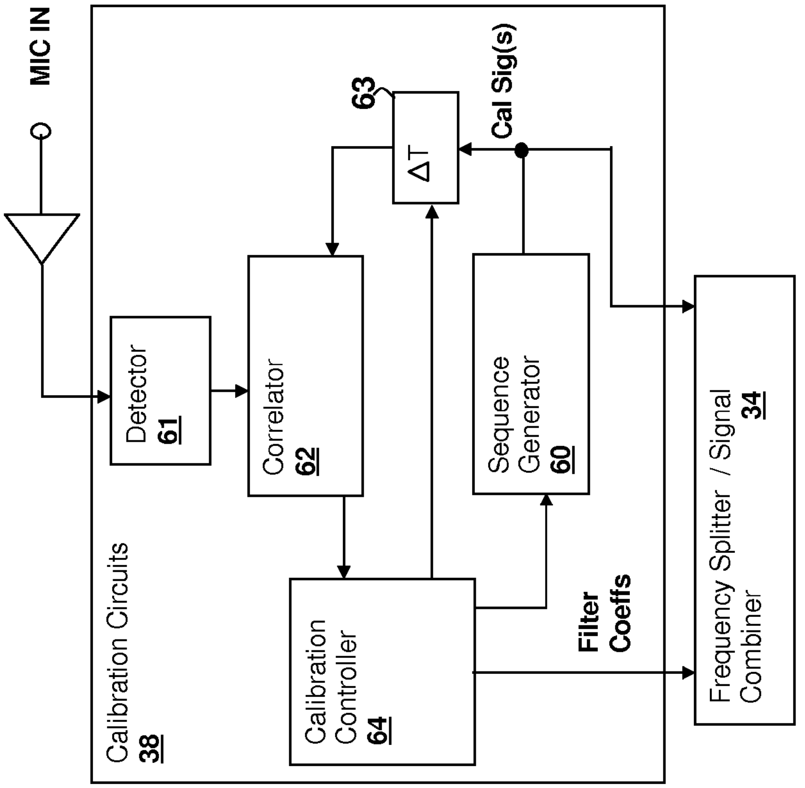
FIG. 7B is a block diagram of a calibration sub-system in accordance with an embodiment of the present invention.
Figure 7A:
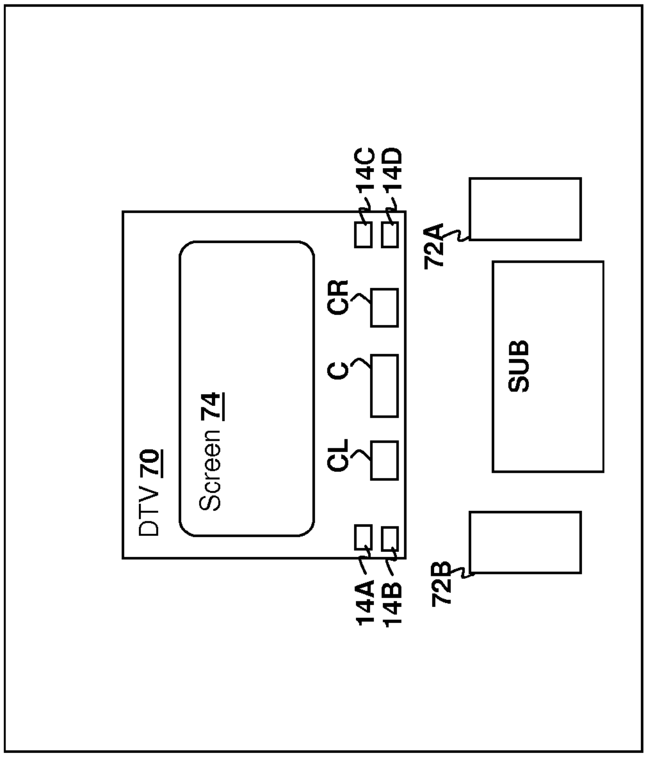
FIG. 7A is an illustration depicting a DTV in accordance with an embodiment of the present invention.

FIG. 7A illustrates one possible implementation of a 5.1 or 7.1 DTV system 70 and a consequent speaker arrangement. DTV 70 includes driver pairs 14A,B and 14C,D and may further include a center speaker C, along with a center left CL and center right CR speaker. A vertical beam-forming speaker array is provided as described above by internal driver pairs 14A,B and 14C,D and may also include external speakers 72A-B that may also have vertical or horizontal beam-forming woofer/tweeter arrangements. A subwoofer/effects channel speaker SUB is located beneath DTV 70. The resultant combination increases the degrees of freedom possible in calibrating maximum surround channel effect via adjustment of the individual FIR filters in the DTV 70 internal processing circuits.

Referring now to FIG. 7B, a calibration sub-system 38 that may be employed in the system of FIG. 3 is illustrated in a block diagram. A calibration controller 64 in response to a user control of DTV 10 applies the output of a sequence generator 60 to frequency splitter/signal combiner network 34. Either one channel can be calibrated at a time, or multiple uncorrelated sequences can be provided to all channels for simultaneous calibration. An adjustable delay 63 applies the sequence signal(s) to a correlator (or multiple correlators) 62 that correlate the sequence(s) with a microphone signal provided from detector 61. The arrangement permits calibration controller 64 to determine the impulse response of each channel at the microphone position. With the microphone placed at the desired listening position, the system can then be calibrated via the adjustment of the filter coefficients and/or overlap filter frequency response within signal combiner/filter network 34 to match the levels provided by the low-frequency drivers with the high-frequency drivers of each speaker for the overlap frequency range. The system may also be calibrated to minimize the reverberant (reflected) energy with respect to the main channel inputs and maximize the reverberation with respect to the surround channel inputs, by adjusting the phase response of each driver with respect to the main and surround channel inputs. While the illustrated calibration system uses a sequence such as a maximal-length sequence (MLS) to extract the impulse response of the system, frequency sweeping, chirping or white/pink noise techniques may be similarly employed, with correlator 62 replaced with an appropriate filter.

Figure 8:
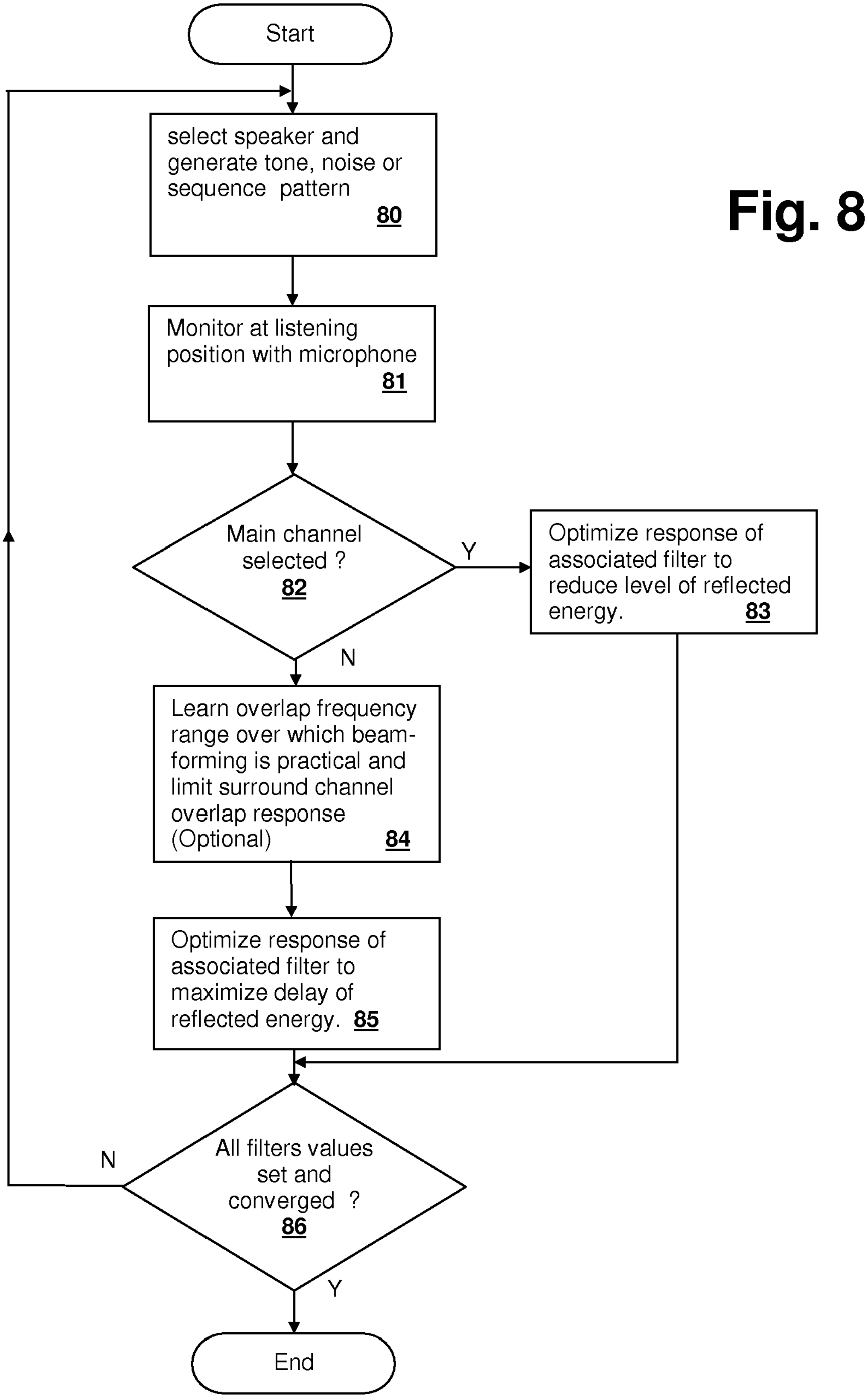
FIG. 8 is a flowchart depicting a calibration method in accordance with an embodiment of the present invention.

Referring now to FIG. 8, a flowchart depicting a calibration method in accordance with an embodiment of the present invention is shown. The illustrated method is for a single channel calibration on each pass, but the multi-channel simultaneous calibration follows the same pattern. First, an audio channel is selected and the tone, noise or sequence is generated through the corresponding channel (step 80). The listening position is monitored with a microphone (step 81) and if the channel under test is a main (direct) channel (decision 82), then the response of the channel filter is optimized to minimize the level of reflected energy (step 83).

If the channel under test is a surround channel (decision 82), the overlap frequency range over which beam-forming is practical can be optionally determined (step 84) from the amount of boost required to match levels from the high-frequency and low frequency drivers and/or detection of the degradation of the null at the listening position due to combing at high frequencies or lack of driver spacing at low frequencies. The above determination can be made via further selection of not only the channel in step 80, but selectively disabling the signal path to each driver from the selected channel by disabling the FIR filter that couples the channel to the associated driver channel. The process from steps 80-85 is repeated over each channel (or performed simultaneously) and also iterated until all filter sets have been calibrated and the values stabilized as between all of the channels (decision 86).

The above-described calibration can be performed by summing the response of the high frequency driver in each driver pair with a time-delayed version of the lower frequency driver response. As the delay is varied, a delay is reached having the greatest surround effect, which is determined as the above-described maximum of the ratio of late response to early response. The figure-of-merit is the ratio of late to early energy in the signal received at the microphone. A reasonable cut-off time for considering energy late vs. early for a typical room, is energy arriving more than 5 ms after the initial impulse response (direct energy) for a single speaker is considered late energy. The impulse response of the adjustable FIR filters in each channel can then be adjusted to accomplish the delay, which can be a frequency dependent delay for each driver. The direct response can also be calibrated in a similar manner, with the delay determined to minimize the reflected energy and maximize the direct (non-reflected) energy.

The description provided above constitutes a description of the preferred embodiments of the invention, but the invention is not limited to the particular implementations shown or described. Those skilled in the art, having seen the above description and accompanying drawings, will understand that changes in form, structure and other details, as well as the order of operation of any operative steps may be varied without departing from the spirit and scope of the invention.

What is claimed is:

1. A method of audio beam-forming, comprising:

providing a first signal to a first speaker driver, wherein said first speaker driver has a first response substantially extending over a first frequency range, and wherein said first signal contains main channel and surround channel information;

providing a second signal to a second speaker driver, wherein said second speaker driver has a second response substantially extending over a second frequency range, wherein substantial portions of said first and second frequency range lie outside of an overlapping frequency range of said first and second response, and wherein said second signal contains said main program and said surround channel information; and controlling a phase relationship between said surround channel information within said first signal and said surround channel information within said second signal in said overlapping frequency range, such that said surround channel information is propagated with a first directivity pattern differing substantially from a second directivity pattern in which said main channel information is propagated.

2. The method of claim 1, further comprising controlling a phase relationship between said main channel information within said first signal and said main channel information within said second signal, such that a shape of said second directivity pattern is controlled.

3. The method of claim 1, wherein said controlling a phase relationship is performed by said first providing said surround channel information in a first polarity to said first speaker driver and second providing said surround channel information in an opposing polarity to said second speaker driver in said overlapping frequency range.

4. The method of claim 1, wherein said first and second speaker drivers are mounted in a single speaker cabinet and wherein said method further comprises:

receiving said main channel information via at least one electrical connector on said speaker cabinet; and receiving said surround channel information via said at least one electrical connector.

5. The method of claim 1, further comprising compressing said first signal in order to prevent damage to said first speaker driver.

6. The method of claim 1, further comprising compressing said surround channel information within said first signal in order to prevent damage to said first speaker driver.

7. The method of claim 1, further comprising controlling a gain of said surround channel information in said first signal with respect to frequency over at least a portion of said overlapping frequency range, whereby a decreasing acoustic response of said first speaker driver for frequencies approaching an edge of said overlapping frequency range is compensated by increasing said gain for frequencies approaching said edge.

8. The method of claim 1, wherein said controlling a phase relationship is performed by calibrating at least one adjustable impulse response filter coupling said surround channel information to said first speaker driver.

9. The method of claim 1, wherein said overlapping frequency range is adjustable and further comprising:

measuring a response of said first speaker driver over frequency to determine a usable limit of said overlapping frequency range; and adjusting an edge of said overlapping frequency range in dependence on a result of said measuring.

10. The method of claim 1, wherein said first speaker driver is a high-frequency driver and further comprising delaying a portion of said surround channel information in a frequency range above said overlapping frequency range and supplying said delayed portion of said surround channel information to said first speaker driver.

11. A system for audio beam-forming, comprising:

a first speaker driver having a first response substantially extending over a first frequency range;

a second speaker driver having a second response substantially extending over a second frequency range, wherein substantial portions of said first and second frequency range lie outside of an overlapping frequency range of said first and second responses; and an electronic network for receiving surround channel information and main channel information and supplying a first signal to said first speaker driver and a second signal to said second speaker driver generated in dependence on both said surround channel information and said main channel information, and wherein said electronic network controls a frequency dependent phase relationship between surround channel information in said first signal and said second signal in said overlapping frequency range, such that said surround channel information is propagated with a first directivity pattern differing substantially from a second directivity pattern in which said main channel information is propagated.

12. The system of claim 11, further comprising a housing, wherein said first and second speaker drivers are mounted conformal to at least one surface of said housing, and wherein said electronic network is mounted internal to said housing.

13. The system of claim 12, wherein said housing is a housing of a consumer device having at least audio capabilities with surround channel and main channel outputs, and wherein said first speaker driver and said second speaker driver provide a simulated surround field from said consumer device.

14. The system of claim 13, wherein said consumer device is a television.

15. The system of claim 11, wherein said electronic network is a passive network having a first output connected to said first speaker driver, a second output connected to said second speaker driver, and having substantially opposing phase response in said overlapping frequency range for said first signal and said second signal with respect to said surround channel information and a substantially uniform response for said first signal and said second signal with respect to said main channel information.

16. The system of claim 15, wherein said passive network comprises a transformer having first, second and third windings, wherein said first winding is coupled to said surround channel signal in a first polarity, said second winding is coupled to said first speaker driver in said first polarity and said third winding is coupled to said second speaker driver in said second polarity.

17. The system of claim 11, wherein said electronic network comprises at least one finite impulse response (FIR) filter for controlling said phase relationship by adjusting a phase of at least said first signal over frequency.

18. The system of claim 11, wherein said electronic network comprises a compressor for compressing said first signal to protect said first speaker driver.

19. The system of claim 11, wherein said electronic network comprises a compressor for compressing said surround channel information in said first signal to protect said first speaker driver.

20. A speaker, comprising:

a cabinet;

a first speaker driver having a first frequency response range and mounted within said cabinet;

a second speaker driver having a second frequency response range extending over a substantially lower range than said first frequency response range and mounted within said cabinet, and wherein said first frequency response range and said second frequency response range overlap in an overlapping frequency range; and an electronic circuit for receiving a surround channel signal bearing surround channel information and a main channel signal bearing main channel information and supplying a first signal to said first speaker driver and a second signal to said second speaker driver generated in dependence on both said surround channel signal and said main channel signal, and wherein said electronic circuit controls a frequency dependent phase relationship between said surround channel information in said first signal and said second signal in said overlapping frequency range, such that said surround channel information is propagated with a first directivity pattern differing substantially from a second directivity pattern in which said main channel information is propagated.

21. The speaker of claim 20, further comprising at least one connector for receiving said main channel signal and said surround channel signal.

22. The speaker of claim 20, further comprising:

at least one connector for receiving said main channel signal; and a surround synthesizer circuit for generating said surround channel signal in response to said main channel signal, whereby said speaker provides a simulated surround environment from said main channel signal.

23. The speaker of claim 20, wherein said first speaker driver is a tweeter and said second speaker driver is a woofer.

24. The speaker of claim 20, wherein said first speaker driver is a midrange driver and said second speaker driver is a woofer.

25. An electronic device, comprising:

an input connection for receiving a source of program information including surround channel and main channel information;

a first output connection for providing a first signal to a high-frequency speaker driver;

a second output connection for providing a second signal to a low-frequency speaker driver, wherein a frequency range of said low-frequency driver and a second frequency range of said high-frequency driver have an overlapping frequency range; and an electronic circuit for receiving said surround channel information and said main channel information and supplying said first signal to said first output connection and said second signal to said second output connection, wherein said first and second signals are generated in dependence on both said surround channel information and said main channel information, and wherein said electronic circuit controls a frequency dependent phase relationship between said surround channel information in said first signal and said second signal in said overlapping frequency range, such that said surround channel information is propagated with a first directivity pattern differing substantially from a second directivity pattern in which said main channel information is propagated.

26. The electronic device of claim 25, wherein said electronic device has a selectable operating mode, wherein said first and second signals are generated in dependence on both said surround channel information and said main channel information when a first operating mode is selected, and wherein said electronic network supplies only said main channel information to said first output connection and only said surround channel information to said second output connection when a second operating mode is selected.

27. The electronic device of claim 25, wherein said first and second output connections are line-level outputs for connection to an external powered speaker having a high-frequency driver, a low-frequency driver and separate amplifiers for each of said high-frequency and low-frequency drivers.

28. The electronic device of claim 25, wherein said electronic circuit further comprises:

a first power amplifier having an output coupled to said first output connection; and a second power amplifier having an output coupled to said second output connection, wherein said first and second electronic connections are power outputs for connection to a an external speaker having a high-frequency driver, a low-frequency driver and separate input terminals for each of said high-frequency and low-frequency drivers.

* * * * *